(12) United States Patent
Matsumoto et al.

(10) Patent No.: US 6,828,723 B2
(45) Date of Patent: Dec. 7, 2004

(54) DISPLAY DEVICE

(75) Inventors: Shoichi Matsumoto, Ogaki (JP); Katsuya Anzai, Anpachi-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/420,946

(22) Filed: Apr. 23, 2003

(65) Prior Publication Data
US 2004/0017149 A1 Jan. 29, 2004

(30) Foreign Application Priority Data
Apr. 24, 2002 (JP) ........................................ 2002-122149

(51) Int. Cl.$^7$ ................................................ H01J 1/54
(52) U.S. Cl. ...................................... 313/500; 313/506
(58) Field of Search ................................ 313/500, 506, 313/509

(56) References Cited

U.S. PATENT DOCUMENTS 6,157,127 A * 12/2000 Hosokawa et al. ......... 313/506
6,563,260 B1 * 5/2003 Yamamoto et al. ......... 313/495

FOREIGN PATENT DOCUMENTS

JP          11-283182          10/1999

* cited by examiner

*Primary Examiner*—David Vu
(74) *Attorney, Agent, or Firm*—Morrison & Foerster LLP

(57) ABSTRACT

The pixel portion of the display device of this invention has the emissive portion including the organic EL element and the circuit portion including the pixel selection TFT and the driving TFT. The cathode layer C1, which is disposed on the emissive portion, is utilized only as the cathode of the organic EL element. The wiring layer made of the same layer as the cathode layer is separated from the cathode layer, and electrically insulated from cathode layer. The wiring layer, which is disposed on the pixel portion, is utilized for other than the cathode. The location to divide the wiring layer from the cathode layer C1 is above the circuit portion in order to prevent the lowered open aperture. Therefore, it is possible to increase the number of the signal lines and source lines without lowering the open aperture.

11 Claims, 10 Drawing Sheets

DISPLAY DEVICE

BACKGROUND OF THE INVENTION

1. Field of the Invention

This invention relates to a display device, especially to an electroluminescent display device.

2. Description of the Related Art

An EL display device with an electroluminescent (referred to as EL hereinafter) element has been gathering attention as a display device substituting a CRT or an LCD. The development effort for the EL display device with a thin film transistor (referred to as TFT hereinafter) as a switching element for driving the EL element has been made accordingly.

FIG. 9 is a plan view of a pixel portion of an organic EL display device. FIG. 10A is a cross-sectional view of the display device along with the A—A line, and FIG. 10B is a cross-sectional view of the display device along with the B—B line shown in FIG. 9.

A pixel portion 115 is formed in the area surrounded with a gate signal line 51 and a drain signal line 52 as shown in FIGS. 9, 10A and 10B. The pixel portions are disposed in a matrix configuration.

An organic EL element 60, which is a light emitting element, a switching TFT 30 for controlling the timing when to supply electric current to the organic EL element 60, a driving TFT 40 for supplying electric current to the organic EL element 60, and a storage capacitance element are disposed in the pixel portion 115. The organic El element 60 is configured from an anode layer 61, an emissive element layer made of light emitting material, and a cathode layer 65.

The first TFT 30, the TFT used for switching, is disposed near the crossing of the two signal lines 51, 52. The source 33s of the TFT 30 works also as a capacitance electrode 55, which forms capacitance with a storage capacitance electrode line 54. The source 33s is also connected to the gate 41 of the second TFT 40, the TFT for driving the EL element. The source 43s of the second TFT 40 is connected to the anode layer 61 of the organic El element 60, and the drain 43d of the second TFT 40 is connected to a driving source line 53, which supplies electric current to the organic EL element 60.

The storage capacitance electrode line 54 is disposed parallel to the gate signal line 51. The storage capacitance electrode line 54 is made of chrome and forms capacitance by accumulating electric charge between itself and the capacitance electrode 55 connected to the source 33s of the TFT through a gate insulating film 12. This storage capacitance 56 is disposed in order to keep the voltage applied to the gate electrode 41 of the second TFT 40.

The organic EL display device is configured by forming the TFT and the organic EL element consecutively on a substrate 10, which is made of a glass, a synthetic resin, a conductive material, or a semiconductor, as shown in FIGS. 10A and 10B. When the conductive substrate or the semiconductor substrate is used as the substrate 10, an insulating film made of $SiO_2$ or SiN should be first disposed on the substrate. Then, the first and second TFTs and the organic EL element are formed. Both TFTs should have a top-gate configuration, where the gate electrode is located above an active layer with the gate insulating film between them.

Next, the first TFT 30 for switching will be explained.

An amorphous silicon film (referred to as a-Si film hereinafter) is formed through a CVD method on the insulating substrate 10, which is made of quartz glass or non-alkaline glass as shown in FIG. 10A. The a-Si film is irradiated by a laser beam for recrystallization from melt, forming a poly-crystalline silicon film (referred to as a p-Si film, hereinafter). This functions as the active layer 33. Single layer or multiple layers of a $SiO_2$ film and a SiN film are formed on the p-Si film as the gate insulating film 12, on which the gate signal line 51, also working as the gate electrode 31, made of a metal with a high-melting point such as Cr and Mo as well as the drain signal line 52 made of Al are disposed.

A $SiO_2$ film, a SiN film and a $SiO_2$ film are sequentially disposed to form an interlayer insulating film 15 on the entire surface of the gate insulating film 32 and the active layer 33. A drain electrode 36, which is formed by filling a contact hole formed at the location corresponding to the drain 33d with a metal such as Al, is disposed, and a planarization film 17 made of organic resin for flattening the surface is formed on the entire surface.

Next, the second TFT 40, the TFT for driving the organic El element will be explained. An a-Si film is formed on the insulating substrate 10. The a-Si film is irradiated by a laser beam for forming a poly-crystalline silicon film functioning as the active layer 43. The gate insulating film 12, and the gate electrode 41 made of a metal with a high-melting point such as Cr and Mo are deposited on the active layer 43. A channel 43c is formed in the active layer 43. A source 43s and a drain 43d are also formed at both sides of the channel 43c. A $SiO_2$ film, a SiN film and a $SiO_2$ film are sequentially disposed to form the interlayer insulating film 15 on the entire surface of the gate insulating film 12 and the active layer 43. The driving source line 53, which is connected to the driving source by filling a contact hole formed at the location corresponding to the drain 43d with a metal such as Al, is disposed. Furthermore, the planarization film 17 made of organic resin for flattening the surface is formed on the entire surface. A contact hole is formed in the planarization film 17 at the location corresponding to the source 43s. The anode layer 61 of the organic El element, which is a transparent electrode made of ITO making contact with the source 43s through the contact hole described above, is formed on the planarization film 17. The anode layer 61 is disposed forming an island for each of the pixel portions.

The organic EL element 60 includes the anode layer 61, a hole transportation layer 62 having a first hole transportation layer made of MTDATA (4,4-bis (3-mathylphenylphenylamino) biphenyl) and a second hole transportation layer made of TPD (4,4,4-tris (3-methylphenylphenylamino) triphenylanine), an emissive layer 63 made of Bebq2 (bis(10-hydroxybenzo[h] quinolinato)beryllium) including quinacridone derivative, an electron transportation layer 64 made of Bebq2, and the cathode layer 65 made of either magnesium-indium alloy, aluminum, or aluminum alloy.

The holes inputted from the anode layer 61 and the electrons inputted from the cathode layer 65 are re-combined in the emissive layer of the organic EL element 60, activating organic molecules of the emissive layer. When the activated molecules are deactivated, light is emitted from the emissive layer, and passes through the transparent anode layer 61 and the transparent insulating substrate to escape outside the display devie as illuminating light. The above technology is described in, for example, Japanese Laid-Open Patent Publication No. H-11 283182.

The cathode layer 65 is disposed covering the entire pixel portion 115 in the above organic EL display device. FIG. 11 shows the layout of one of the pixels of the display device. The pixel portion 200, which is the same as the pixel portion 115 of FIG. 9, has an organic emissive portion 201 that includes the organic EL element 60 and a circuit portion 202 that includes the switching and driving TFTs. The cathode layer 1C of the organic El element is disposed on the entire pixel portion 200.

The wiring materials such as aluminum used for the cathode layer is only utilized as the cathode layer, and they are not used for other wiring in the conventional organic EL display device. Therefore, the open aperture of this display device decreases when new signal lines and new source lines are formed in the display panel, leading to lowered luminescence of the organic EL display device.

SUMMARY OF THE INVENTION

The invention provide a display device having a plurality of pixels. Each of the pixels includes an electroluminescent element having an anode layer, a cathode layer and an emissive layer disposed between the anode layer and the cathode layer, a driving transistor for driving the electroluminescent element, and a cathode level wiring layer disposed above the driving transistor. The cathode layer is a part of the cathode level wiring layer. The device also includes a device wiring layer that is a part of the cathode level wiring layer and is electrically insulated from the cathode layer.

The invention also provides a display device including a plurality of pixels. Each of the pixels includes an electroluminescent element having an anode layer, a cathode layer and an emissive layer disposed between the anode layer and the cathode layer, a driving transistor for driving the electroluminescent element, a peripheral driving circuit for driving the driving transistor, and a cathode level wiring layer disposed above the driving transistor. The cathode layer is a part of the cathode level wiring layer. The device also includes a peripheral wiring layer that is a part of the cathode level wiring layer and is electrically insulated from the cathode layer. The peripheral wiring layer is connected to the peripheral driving circuit.

DETAILED DESCRIPTION OF THE INVENTION

Figure 1A:
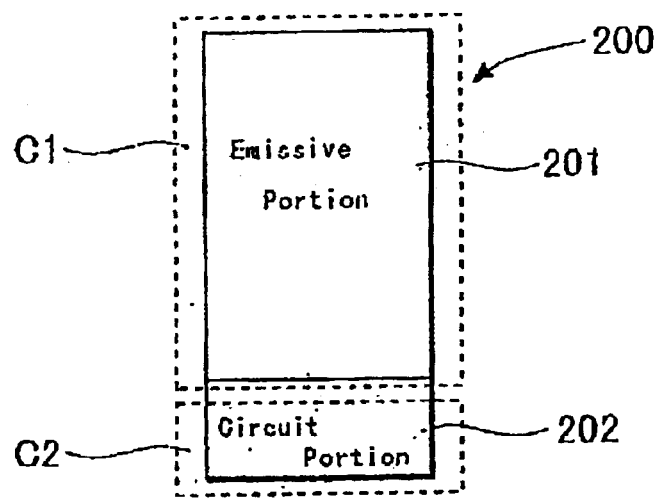
FIGS. 1A, 1B and 1C show three different layouts of a pixel portion of an organic EL display device of an embodiment of this invention.
Figure 1B:
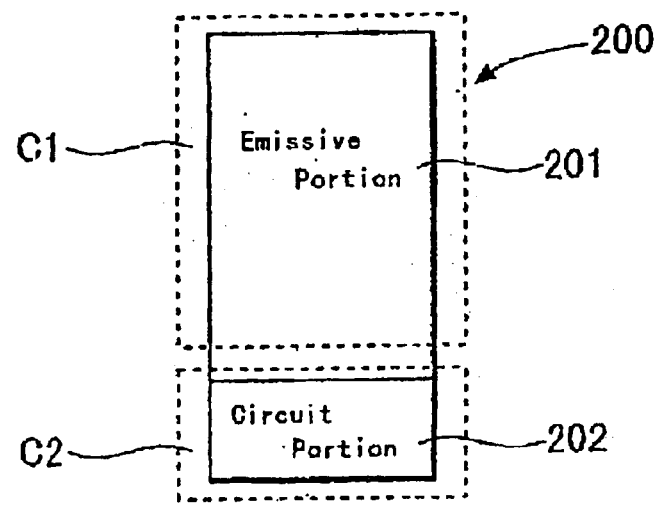
Figure 1C:
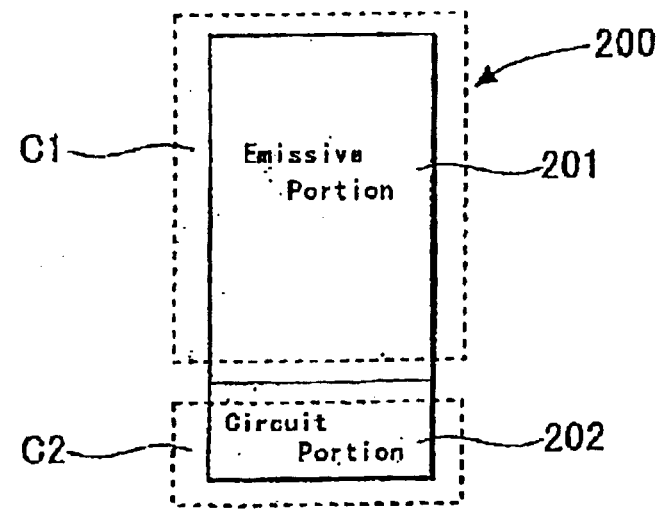
Figure 9:
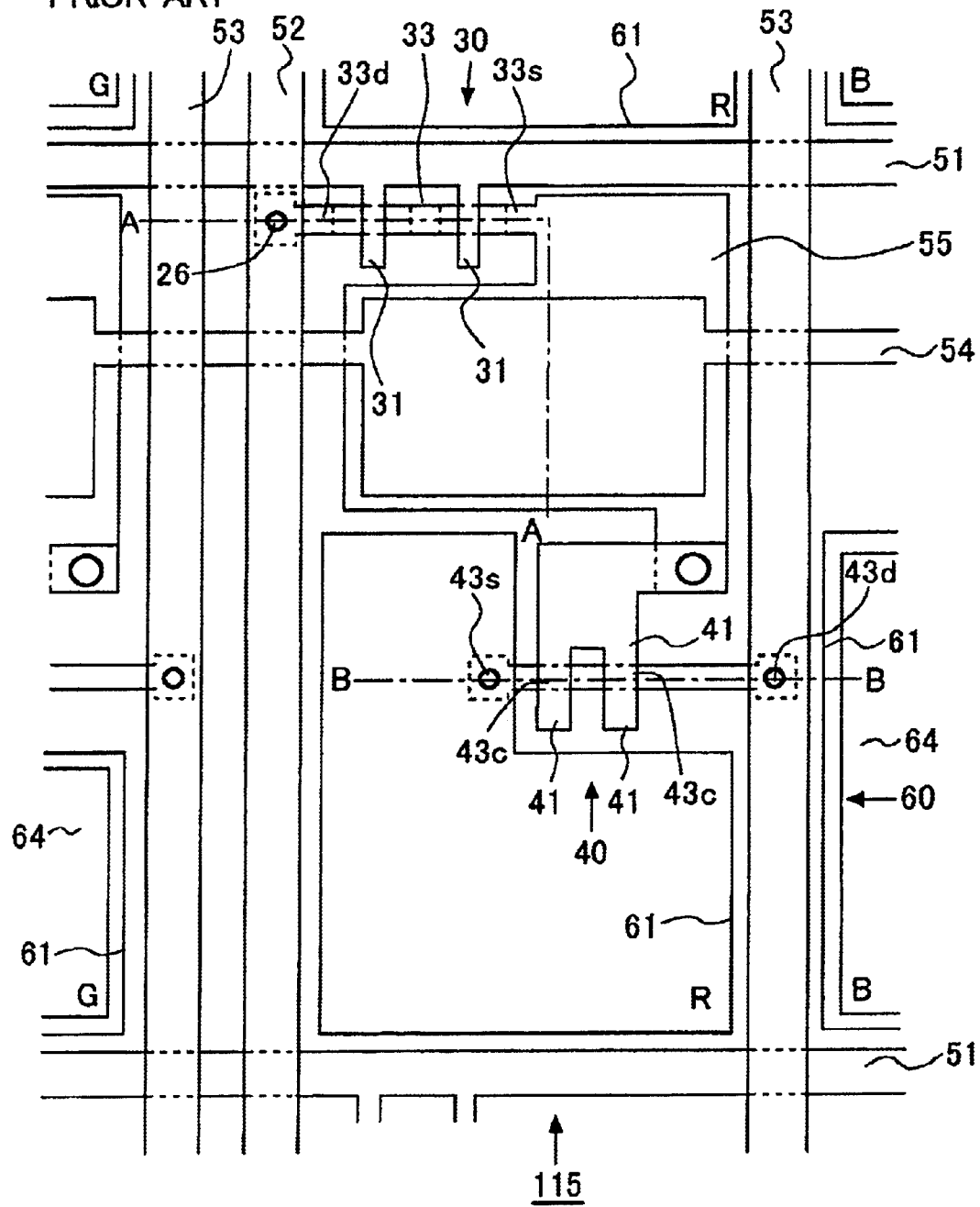
FIG. 9 is a plan view of a pixel portion of a conventional organic EL display device
Figure 10A:
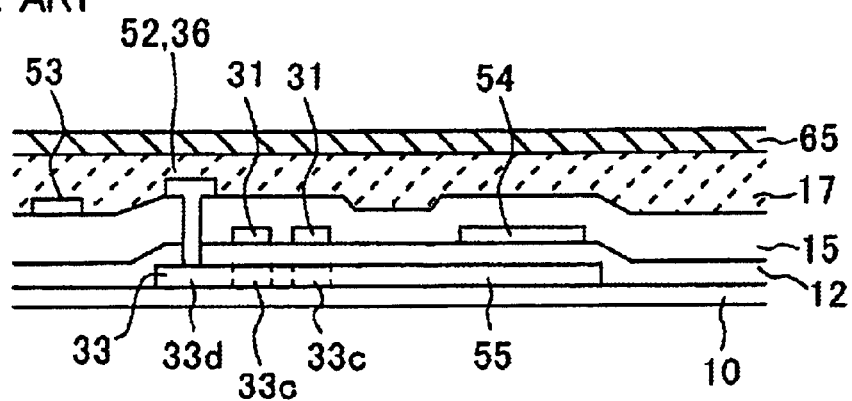
FIGS. 10A and 10B are a cross-sectional views of the pixel portion of the organic EL display device of FIG. 9.
Figure 10B:
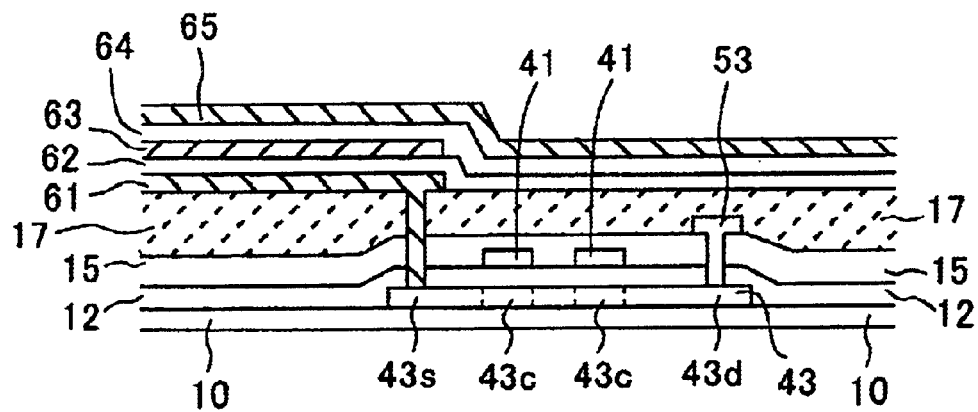
Figure 11:
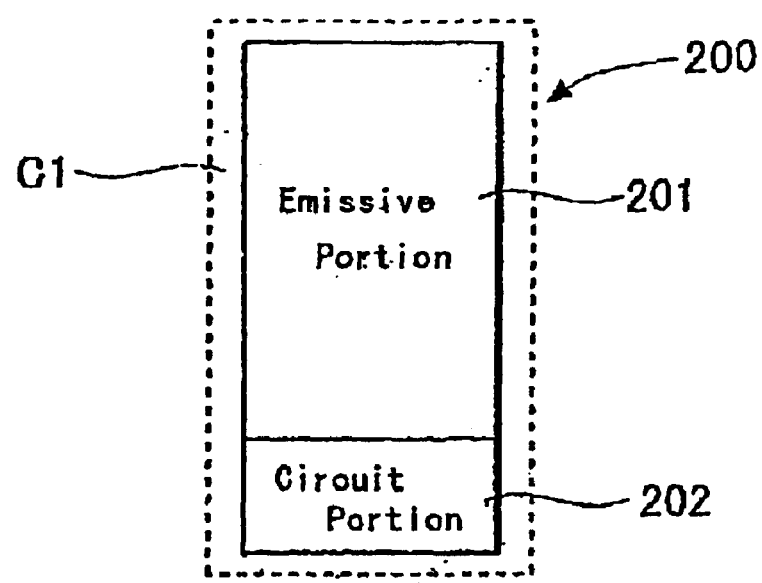
FIG. 11 shows a layout of a pixel portion of the organic EL element of the organic EL display device of FIG. 9.

FIGS. 1A, 1B, and 1C show a layout of an organic EL display device of an embodiment of this invention. A pixel portion 200 is configured from an emissive portion 201, which includes an organic EL element, and a circuit portion 202, which includes a TFT for selecting a pixel as well as a TFT for driving the EL element. The structures of these device elements of this embodiment are the same as those shown in FIGS. 9–10B. A plurality of pixel portions is disposed in a matrix configuration in an actual display device.

A cathode layer C1 is deposited on the emissive portion 201, and used only as the cathode layer for the organic EL element. A wiring layer C2 is made of the same layer as the cathode layer C1 (the same wiring materials), separated from the cathode layer C1 for being electrically insulated from the cathode layer C1, and deposited on the circuit portion 202 adjacent to the cathode layer C1. It is preferable to divide the layer into the cathode layer C1 and the wiring layer C2 at a location above the circuit portion 202 in order to prevent the decrease of the open aperture.

However, the configuration of the cathode layer 1 and the wiring layer C2 is not limited to the one shown in FIG. 1A. For example, the location to divide the layer into the cathode layer Cl and the wiring layer C2 can be above the emissive portion 201 as shown in FIG. 1B. It is also possible to divide the layer into the cathode layer C1 and the wiring layer C2 just above the boundary between the emissive portion 201 and the circuit portion 202 as shown in FIG. 1C. That is, the entire portion of the cathode layer C1 is not necessarily disposed on the emissive portion 201. Likewise, the entire portion of the wiring layer C2 is not necessarily disposed on the circuit portion 202. The wiring layer C2 can be utilized for the purpose other than the cathode layer C1, for example, it is utilized for a power source wiring layer and a signal wiring layer.

Figure 2A:
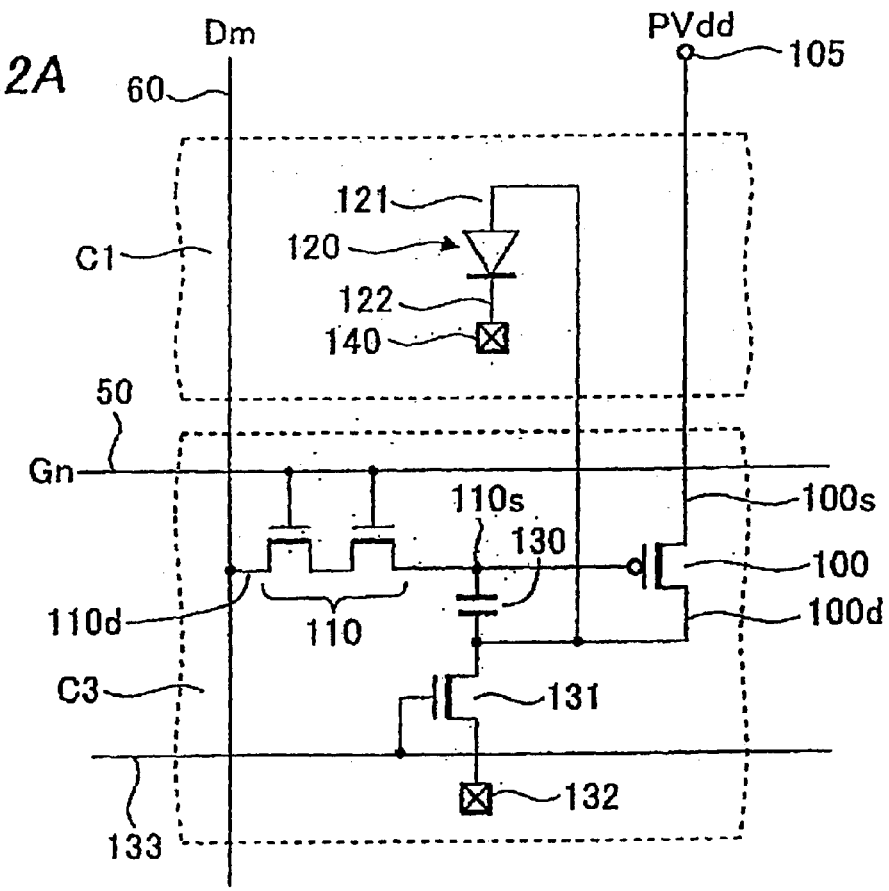
FIG. 2A is a first layout circuit diagram of a pixel portion of the organic EL display device of the embodiment of this invention.

Next, the layout of the wiring scheme of this embodiment will be described with reference to FIGS. 2A–B. FIG. 2A is the layout circuit diagram of one pixel portion 200 of the organic EL display device. The wiring layer separated from the cathode layer C1 is used as a power source wiring layer C3 for applying a reverse bias to the organic El element 120 in this example.

The pixel portion includes a pixel selection TFT 110, a driving TFT 100 for driving the organic EL element, and the organic EL element 120 disposed near the crossing of a gate signal line 50 of the n-th column and a drain signal line 60 of the m-the row. A plurality of pixel portions is disposed in a matrix configuration.

The gate signal line 50 for supplying a gate signal Gn and the drain signal line 60 for supplying a drain signal, a video signal Dm, cross each other. The organic EL element 120, the driving TFT 100, and the pixel selection TFT 110 are disposed near the crossing of the two signal lines. The TFT 100 is N-channel type and the TFT 110 is P-channel type.

A driving source 105 is connected to the source 100s of the driving TFT 100 and provided with a plus driving voltage PVdd from the driving source 105. The drain 100d of the TFT 100 is connected to an anode 121 of the organic EL element 120.

The gate signal line 50 is connected to the gate of the pixel selection TFT 110 and provided with the gate signal Gn. The drain signal line 60 is connected to the drain 110d of the pixel selection TFT 110 and provided with the video signal Dm. The source 110s of the TFT 110 is connected to the gate of the TFT 100. The gate signal Gn is outputted from a gate driver circuit not shown in the figure, and the video signal Dm is outputted from a drain driver circuit not shown in the figure.

Also, the organic EL element 120 includes the anode 121, a cathode 122, and an emissive layer, not shown in the figure, inserted between the anode 121 and the cathode 122. The cathode 122 is connected with the cathode layer C1, which is connected to a negative power source not shown in the figure.

A storage capacitance element 130 is connected to the gate of the TFT 100. That is, one of the electrodes of the storage capacitance element 130 is connected to the gate, and the other electrode is connected to a TFT 131. The storage capacitance element 130 is disposed in order to hold the video signal Dm of the pixel portion for one field period by keeping the charge corresponding to the video signal Dm.

The TFT 131 is disposed for restoring the luminescent property of the organic EL element by applying the reverse bias to the organic El element, and connected between the anode 121 of the organic EL element 120 and the negative power source wiring layer C3. The source 131s of the TFT 131 is connected to the minus source wiring layer C3 through a contact 132. The gate of the TFT 131 is connected to a signal line 133 for controlling the switching of the operation. The minus source wiring layer C3 is adjacent to the cathode layer C1 but electrically insulated from the cathode layer C1.

The operation of the EL display device with the above configuration is as follows. The TFT 110 turns on when the gate signal Gn becomes a high level for one horizontal period. Then, the video signal Dm is supplied from the drain signal line 60 to the gate of the TFT 100 through the TFT 110. The conductance of the TFT 100 changes according to the video signal Dm supplied to the gate and the corresponding driving electric current goes through the driving source 105, the TFT 100, the organic EL element 120 and the cathode C1. This turns on the organic EL element 120, accordingly.

The luminescence of the organic EL element 120 is deteriorated as the time passes. However, the reverse bias is applied to the organic EL element 120 from the negative power source wiring layer C3 by turning on the TFT 131, restoring the luminescence of the organic EL element 120. The voltage of the negative power source wiring layer C3 is lower than that of the cathode layer C1 because it provides the reverse bias to the organic EL element. Since the organic EL element 120 is regarded as a diode, it is in the state of the reverse bias when the voltage of the cathode 122 is lower than the voltage of the anode.

Figure 2B:
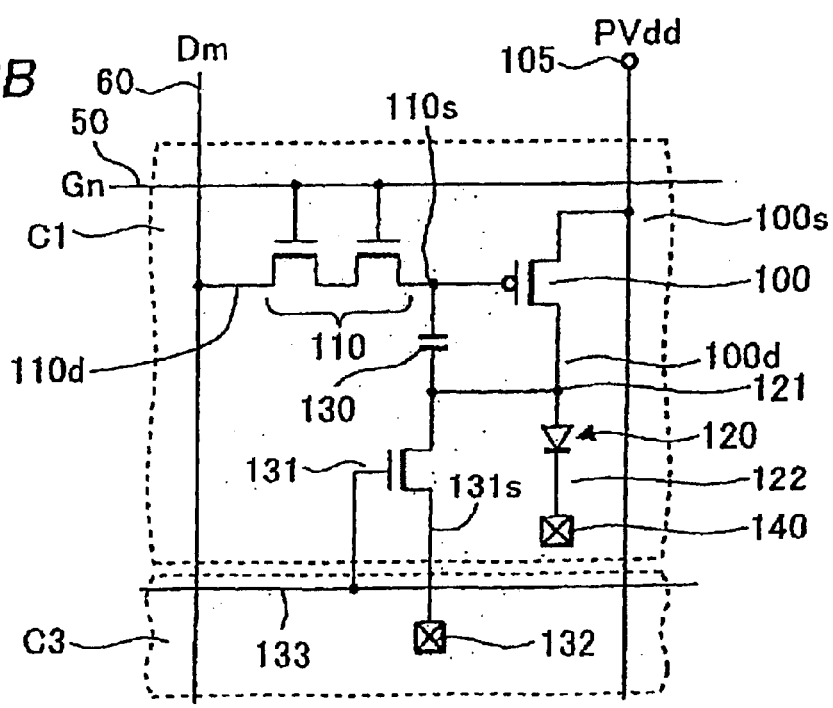
FIG. 2B is a layout circuit diagram with a modification to the layout of FIG. 2B.

FIG. 2B is a layout circuit diagram of the pixel portion 200 of FIG. 2A with a modified wiring configuration. In the wiring layout of FIG. 2A, the switching and driving TFTs 110, 100 and the storage capacitance element 130 are placed under the negative power source wiring layer C3. However, in this modification, the switching and driving FETs and the storage capacitance element are placed under the cathode layer C1. As shown in this modified configuration, it is possible to place all or some of those circuit elements under the cathode layer C1 if necessary.

Figure 3:
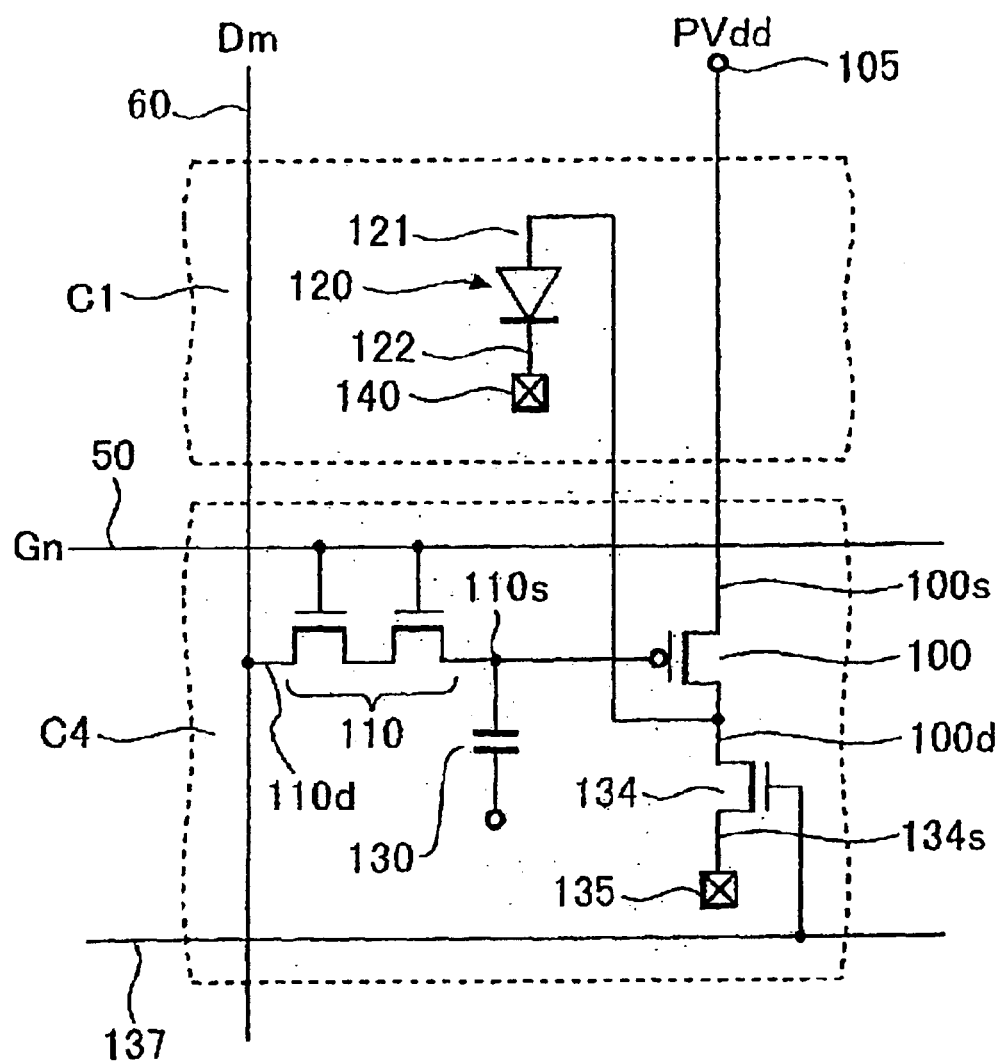
FIG. 3 is a second layout circuit diagram of a pixel portion of the organic EL display device of the embodiment of this invention.

FIG. 3 is another layout circuit diagram of one pixel portion of the organic EL display device. The wiring layer separated from the cathode layer C1 is used as a power source wiring layer C4 for discharge in this example. A TFT 134 for discharge is disposed between the anode 121 of the organic EL element 120 and the power source wiring layer C4. The gate of the TFT 134 is connected to a signal line 137 for controlling the switching of the operation. The source 134s of the TFT 134 is connected to the power source wiring layer C4 through a contact 135. The power source wiring layer C4 for discharge is adjacent to the cathode layer C1, but electrically insulated from the cathode layer C1. The other configuration is the same as the organic El display device shown in FIG. 2A.

When the electric charge remains at the anode 121 of the organic El element 120, it appears as the image from the previous display of the organic EL display device. The TFT 134 and the power source wiring layer C4 are used for discharging the remaining electric charge. The voltage of the power source wiring layer C4 can be the same voltage as or the different voltage from the voltage of the cathode layer C1.

Figure 4:
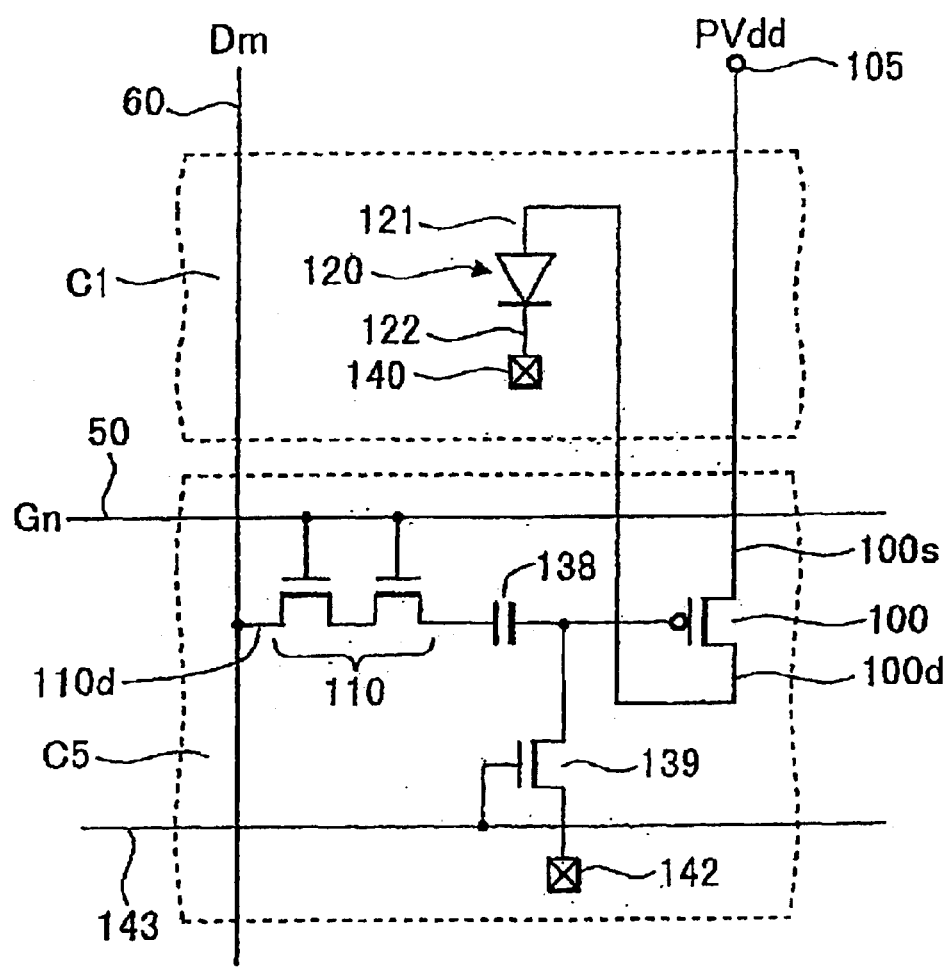
FIG. 4 is a third layout circuit diagram of a pixel portion of the organic EL display device of the embodiment of this invention.

FIG. 4 is another layout circuit diagram of one pixel portion of the organic EL display device. The wiring layer separated from the cathode layer C1 is used as a power source wiring layer C5 for resetting in this example. A coupling capacitance element 138 is disposed between the pixel selection TFT 110 and the organic EL element driving. TFT 100. The video signal Dm is applied to the gate of the TFT 100 for driving the organic EL element through the coupling capacitance element 138.

A TFT 139 for resetting is connected between the gate of the organic EL element driving TFT 100 and the power source wiring layer C5 for resetting. The source 139s of the TFT 139 is connected to the power source wiring layer C5 for resetting through a contact 142. The gate of the TFT 139 is connected to a signal line 143 for controlling the switching of the operation. The source wiring layer C5 for resetting is adjacent to the cathode layer C1 but electrically insulated from the cathode layer C1.

The TFT 139 and the source wiring layer C5 for resetting are rerquired due to the following reason. The threshold voltage Vt of the organic EL element driving TFT 100 and the threshold voltage VFt of the organic EL element 120 vary due to the variation of the manufacturing. Therefore, the electric current going through the organic EL element driving TFT 100 also varies even if the same video signal Dm is applied.

The voltage of the gate of the organic EL element driving TFT 100 is reset to Vt+VFt before the video signal Dm is applied in order to apply the same effective electric current corresponding to a video signal Dm. Here, the value of Vt+VFt has been known beforehand be monitoring the voltage. Therefore, the voltage of the power source wiring layer C5 is set at Vt+VFt.

Figure 5:
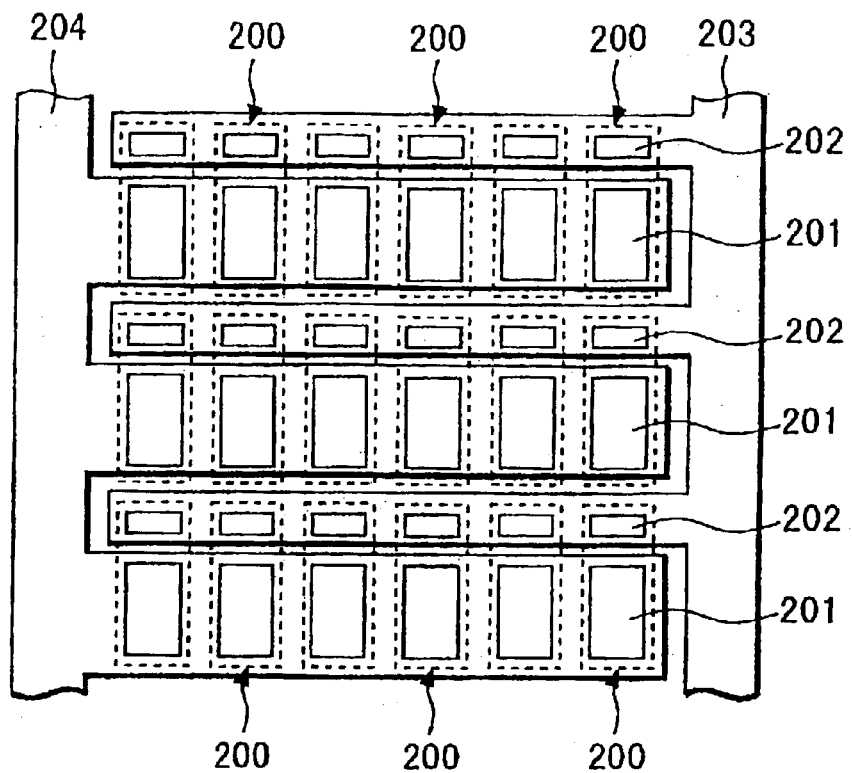
FIG. 5 is another layout of the organic EL display device of the embodiment of this invention.
Figure 6:
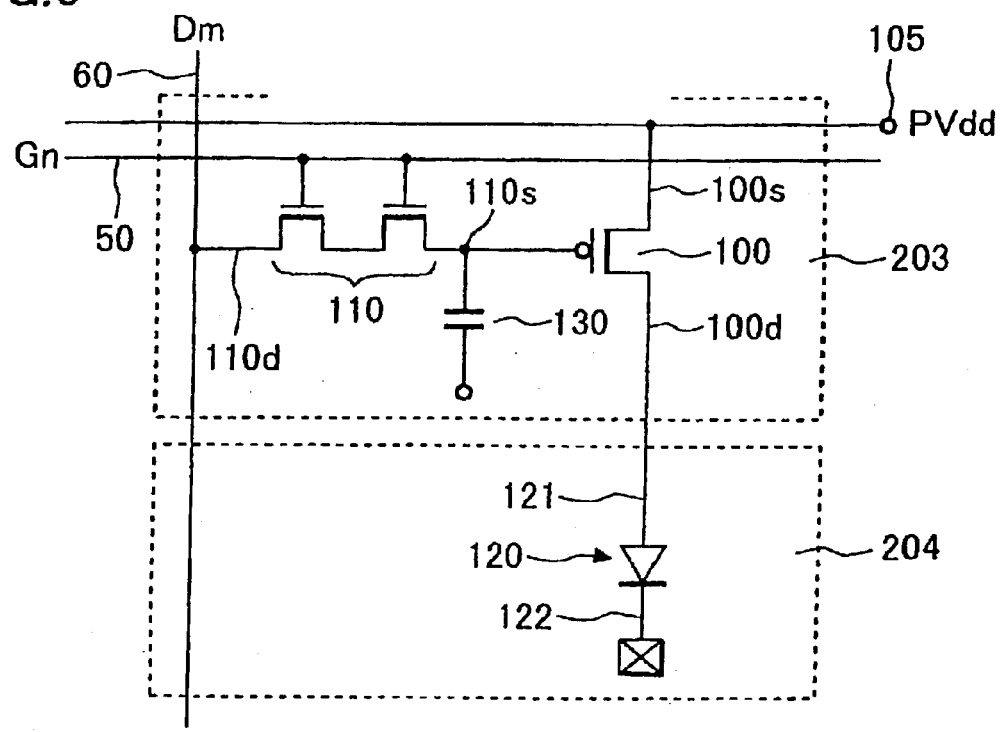
FIG. 6 is an equivalent circuit diagram of the pixel portion of the organic El display device of FIG. 5.

FIG. 5 is another layout showing a plurality of the pixel portions of the organic EL display device. FIG. 6 is an equivalent circuit diagram of the pixel portions 200 of the organic El display device shown in FIG. 5. The same reference numerals are given to the same configurations in FIGS. 5, 6 as those in FIGS. 1 and 2.

The wiring layer separated from the cathode layer 204 of the organic EL element 120 is used as a PVdd line 203 for supplying a positive driving voltage PVdd to the organic EL element 120. That is, the material used for the cathode layer 204 (for example, aluminum) functions also as the PVdd line 203.

The pixel portions are disposed in a matrix configuration forming a display region as shown in FIG. 5. The cathode layer 204 is disposed extending over emissive portions 201 of a plurality of the pixel portions 200 that align in the row direction. The cathode layer 204 is connected at the left edge of the figure, forming a comb-like configuration as a whole. The region where the emissive portion 201 is disposed is the region where the organic El element is formed.

Likewise the PVdd line 203 is disposed extending over circuit portions 202 of the pixel portions 200 that align in the row direction. The PVdd line 203 is connected at the right edge of the figure, forming a comb-like configuration as a whole. The region where the circuit portion 202 is disposed is the region where the organic EL element driving TFT 100, the pixel selection TFT 110, and the storage capacitance element 130 are formed. The cathode layer 204 and the PVdd line 203, both with the comb-like configurations, are disposed adjacent to each other over the display region, interdigitating each other.

The above configuration enables the dense wiring of the PVdd line 203 for supplying the electric source to the organic EL element 120 without lowering the open aperture of the pixel portion 200.

Figure 7:
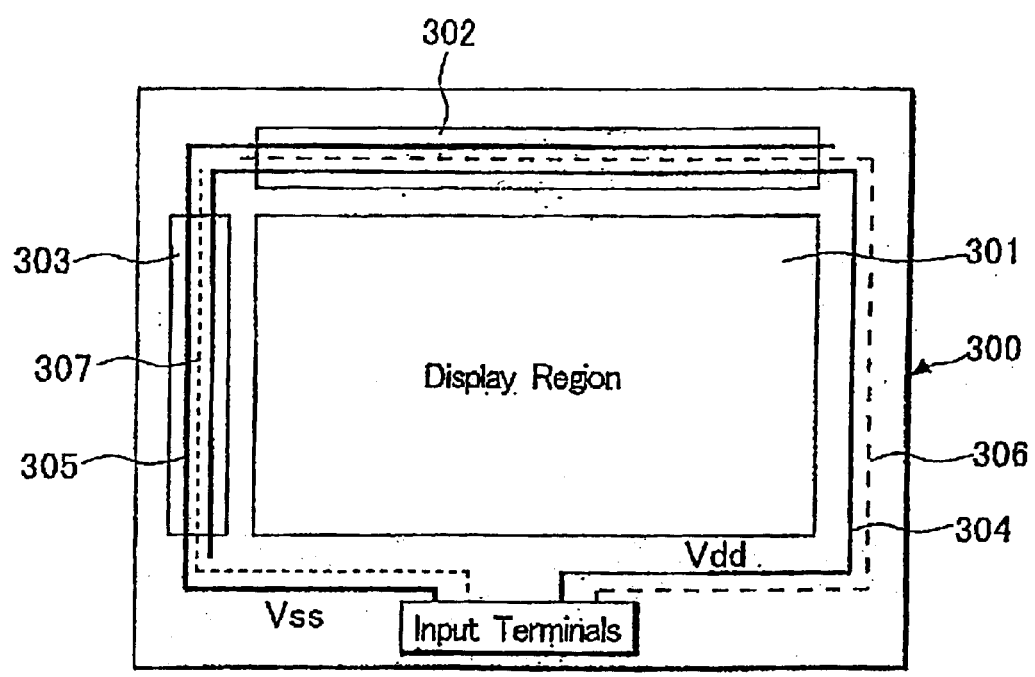
FIG. 7 is a panel layout of the organic El display device of the embodiment of this embodiment.

A drain driver circuit 302 which supplies the data signal Dm to each of the pixel portions and a gate driver circuit 303 which supplies the gate signal Gn to each of the pixel portions are disposed in the peripheral area of a display region 301, which includes a plurality of the pixel portions in an organic EL display device, as shown in FIG. 7. The signal lines and power source lines in the peripheral driving circuit portion can also be formed in the same layer as the cathode layer C1 in FIG. 1. For example, the power source lines 304 and 305, which supply the electric source to the drain driver circuit 302 and the gate driver circuit 303 respectively, can be formed in the same layer as the cathode layer C1. A drain driver signal line 306 supplying the drain driving signal to the drain driver circuit 302 and a gate driver signal line 307 supplying the gate driving signal to the gate driver circuit 303 can be also formed in the same layer as the cathode layer C1.

Therefore, it is possible to form those lines superimposed over the drain driver circuit 302 and the gate driver circuit 303 as shown in FIG. 7, providing an increased number of signal lines and source lines without enlarging the area occupied by the peripheral driving circuit portion.

Figure 8:
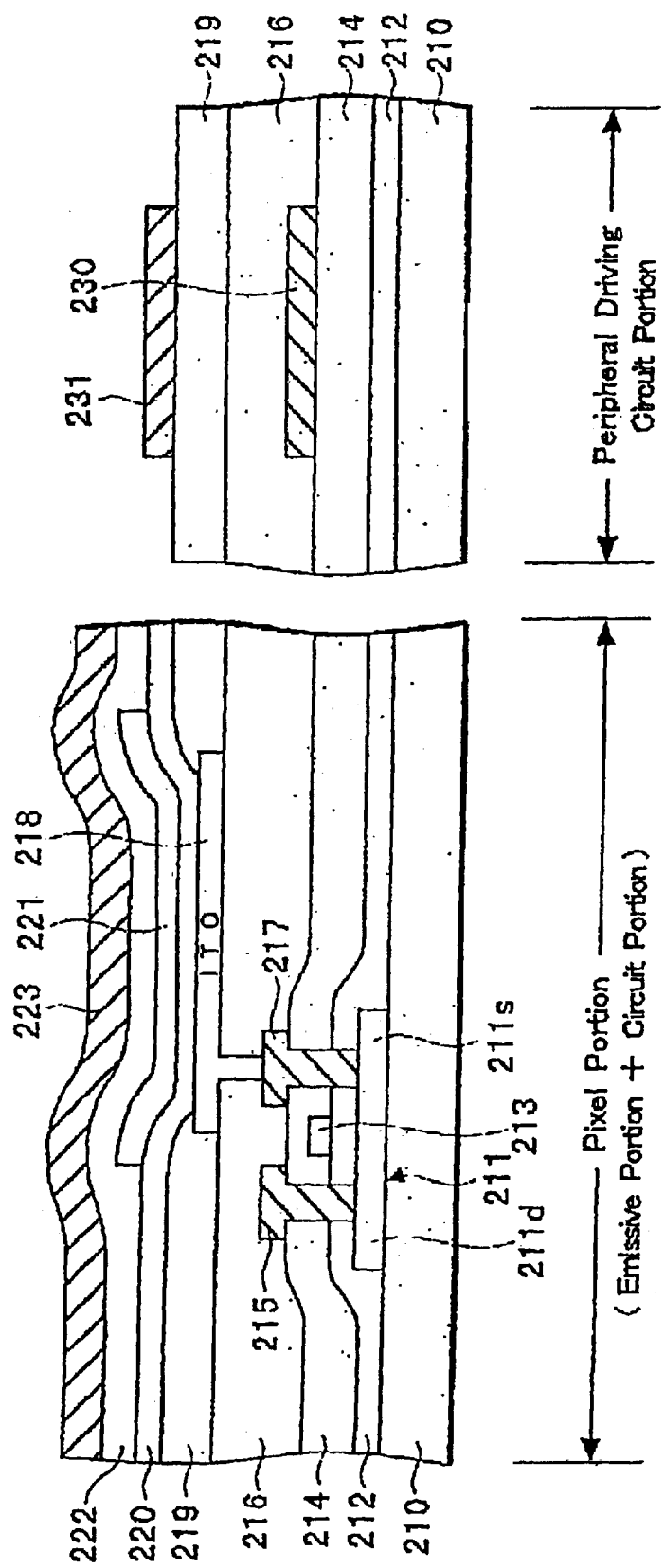
FIG. 8 is a partial cross-sectional view showing the pixel portion and the peripheral driving circuit portion of the organic EL display device of the embodiment of this invention.

FIG. 8 is the partial cross-sectional view showing a pixel portion and a peripheral driving circuit portion of the organic EL display device. The organic EL element and a driving TFT are shown in the pixel portion, and wiring layers are shown in the peripheral driving circuit portion.

An active layer 211 and a gate electrode 213 are disposed consecutively on an insulating substrate 210. The active layer 211 has a channel region, and a source 211s and a drain 211d are disposed at both sides of the channel region.

Then, a $SiO_2$ film, a SiN film and a $SiO_2$ film are sequentially disposed to form an interlayer insulating film 214 on the entire surface of the gate insulating film 212 and the active layer 211. A power source line 215 (drain electrode), which is connected to a driving source PVdd by filling a contact hole formed at the location corresponding to the drain 21 Id with a metal such as Al, is disposed. Furthermore a first planarization film 216 made of organic resin for flattening the surface is formed on the entire surface. A contact hole is formed in the planarization film 216 at the location corresponding to the source 211s. An anode layer 218 of the organic EL element, which is a transparent electrode made of ITO making a contact with a source electrode 217 through the contact hole described above, is formed on the planarization film 216. The anode layer 218 is disposed forming an island for each of the pixel portions.

A second planarization film 219 is further formed. A part of the second planarization film 219 located above the anode layer 218 is then removed. The organic EL element is formed by depositing the anode layer 218, a hole transportation layer 220, an emissive layer 221, an electron transportation layer 222, and a cathode layer 223 in this order.

A first wiring layer 230 is formed on the interlayer insulating film 214 in the peripheral circuit portion. The first wiring layer 230 is the same layer as that of the power source wiring layer 215, and the source electrode 217 in the pixel portion. Although the interlayer insulating film 214 and the gate insulating film 212 are formed under the first wiring layer 230, these films are not necessary for the wiring region and can be removed from the region.

A second wiring layer 231 is formed on the second planarization film 219. The second wiring layer 231 is the same layer as that of the cathode layer 223 in the pixel portion, although the two layers appear at different level in the figure. The second wiring layer 231 may be used for the power source lines 304, 305 for supplying the electric source to the drain driver circuit 302 and the gate driver circuit 303 respectively, the drain driver signal line 306 for supplying the drain driver signal to the drain driver circuit 302, and the gate driver signal line 307 for supplying the gate driver signal to the gate driver circuit 303.

Since the first planalozation layer 216 and the second planarization layer 219 are located underneath of the second wiring layer 231, the parasitic capacitance of the second wiring layer 231 is smaller compared to the parasitic capacitance of the first wiring layer 230. Therefore, the high-speed operation as well as the low-energy consumption can be achieved.

What is claimed is:

1. A display device including a plurality of pixels, each of the pixels comprising:
   an electroluminescent element comprising an anode layer, a cathode layer and an emissive layer disposed between the anode layer and the cathode layer;
   a driving transistor for driving the electroluminescent element;
   a cathode level wiring layer disposed above the driving transistor, the cathode layer being a part of the cathode level wiring layer; and
   a device wiring layer that is a part of the cathode level wiring layer and is electrically insulated from the cathode layer.

2. The display device of claim 1, wherein the device wiring layer is disposed adjacent the cathode layer and covers the driving transistor.

3. The display device of claim 1, wherein the device wiring layer is a source wiring layer.

4. The display device of claim 3, wherein the source wiring layer is connected to a reverse bias source that supplies a reverse bias to the electroluminescent element.

5. The display device of claim 3, wherein the source wiring layer is configured to discharge electric charges accumulated in the anode of the electroluminescent element.

6. The display device of claim 3, wherein the source wiring layer is configured to reset a gate voltage of the driving transistor.

7. The display device of claim 1 wherein the device wiring layer is a signal wiring layer.

8. The display device of claim 1, wherein the device wiring layer is a wiring layer supplying a driving voltage to the electroluminescent element.

9. A display device including a plurality of pixels, each of the pixels comprising:

an electroluminescent element comprising an anode layer, a cathode layer and an emissive layer disposed between the anode layer and the cathode layer;

a driving transistor for driving the electroluminescent element;

a peripheral driving circuit for driving the driving transistor;

a cathode level wiring layer disposed above the driving transistor, the cathode layer being a part of the cathode level wiring layer; and a peripheral wiring layer that is a part of the cathode level wiring layer and is electrically insulated from the cathode layer, the peripheral wiring layer being connected to the peripheral driving circuit.

10. The display device of claim 9, wherein the peripheral wiring layer is connected to an input terminal for supplying an electric power to the peripheral driving circuit.

11. The display device of claim 9, wherein the peripheral wiring layer is a signal wiring layer of the peripheral driving circuit.

* * * * *